(12) United States Patent
Zhu et al.

(10) Patent No.: US 12,342,560 B2
(45) Date of Patent: Jun. 24, 2025

(54) TRANSISTORS WITH SOURCE-CONNECTED FIELD PLATES

(71) Applicant: NXP USA, Inc., Austin, TX (US)

(72) Inventors: Congyong Zhu, Gilbert, AZ (US);
Anthony Ciancio, Gilbert, AZ (US);
Fred Reece Clayton, Mesa, AZ (US);
Lawrence Scott Klingbeil, Chandler, AZ (US); Bernhard Grote, Phoenix, AZ (US)

(73) Assignee: NXP USA, Inc., Austin, TX (US)

( * ) Notice: Subject to any disclaimer, the term of this patent is extended or adjusted under 35 U.S.C. 154(b) by 486 days.

(21) Appl. No.: 17/645,276

(22) Filed: Dec. 20, 2021

(65) Prior Publication Data

US 2023/0197829 A1 Jun. 22, 2023

(51) Int. Cl.
*H10D 30/01* (2025.01)
*H10D 30/47* (2025.01)
*H10D 62/85* (2025.01)
*H10D 64/00* (2025.01)

(52) U.S. Cl.
CPC ......... *H10D 30/015* (2025.01); *H10D 30/471* (2025.01); *H10D 30/475* (2025.01); *H10D 62/8503* (2025.01); *H10D 64/111* (2025.01)

(58) Field of Classification Search
CPC .......... H01L 29/66462; H01L 29/2003; H01L 29/402; H01L 29/7786; H01L 29/0684; H01L 29/1029; H01L 29/41; H01L 29/778

See application file for complete search history.

(56) References Cited

U.S. PATENT DOCUMENTS

| | | | |
|---|---|---|---|
| 6,867,078 B1 | 3/2005 | Green et al. | |
| 7,291,872 B2 | 11/2007 | Hikita et al. | |
| 7,592,211 B2 | 9/2009 | Sheppard et al. | |
| 7,696,535 B2 | 4/2010 | Yang et al. | |
| 7,812,369 B2 | 10/2010 | Chini et al. | |
| 8,049,252 B2 | 11/2011 | Smith et al. | |
| 8,120,064 B2 | 2/2012 | Parikh et al. | |
| 8,946,779 B2 | 2/2015 | Green et al. | |
| 9,419,122 B1 | 8/2016 | Corrion et al. | |
| 9,741,840 B1 | 8/2017 | Moens et al. | |
| 9,847,411 B2 | 12/2017 | Sriram et al. | |
| 9,911,817 B2 | 3/2018 | Xia et al. | |
| 12,148,820 B2 * | 11/2024 | Zhu .................... | H10D 62/8503 |

(Continued)

FOREIGN PATENT DOCUMENTS

| | | | |
|---|---|---|---|
| CN | 11232661 A | 2/2021 | |
| CN | 113628964 A1 | 11/2021 | |
| WO | WO-2017069464 A1 * | 4/2017 | ........... H01L 29/423 |

OTHER PUBLICATIONS

Denninghoff, Daniel J. et al; "Design of High-Aspect-Ratio T-Gates on N-Polar GaN/AlGaN MIS-HEMTs for High f max"; IEEE Electron Device Letters, vol. 33, No. 6; 3 pages (Jun. 2012).

(Continued)

*Primary Examiner* — Joseph C. Nicely
*Assistant Examiner* — Alvin L Lee

(57) ABSTRACT

Placement of a field plate in a field-effect transistor is optimized by using multiple dielectric layers such that a first end of field plate is separated from a channel region of the transistor by a first set of one or more distinct dielectric material layers. A second end of the field plate overlies the channel region and a gate electrode from which it is separated by the first set of dielectric layers and one or more additional dielectric layers.

11 Claims, 10 Drawing Sheets

(56) References Cited

U.S. PATENT DOCUMENTS

| | | | |
|---|---|---|---|
| 2006/0060895 A1* | 3/2006 | Hikita | H01L 29/7787 257/280 |
| 2008/0128752 A1 | 6/2008 | Wu | |
| 2012/0146107 A1 | 6/2012 | Lim et al. | |
| 2013/0193485 A1 | 8/2013 | Akiyama et al. | |
| 2013/0341679 A1 | 12/2013 | Green et al. | |
| 2014/0061659 A1 | 3/2014 | Teplik et al. | |
| 2014/0361343 A1 | 12/2014 | Sriram | |
| 2015/0279722 A1* | 10/2015 | Kikuchi | H01L 21/765 257/192 |
| 2017/0154988 A1 | 6/2017 | Hurkx et al. | |
| 2018/0033669 A1 | 2/2018 | Salih et al. | |
| 2019/0028066 A1* | 1/2019 | Mahon | H01L 29/7786 |
| 2019/0097001 A1 | 3/2019 | LaRoche et al. | |
| 2019/0140086 A1 | 5/2019 | Chikamatsu | |
| 2021/0336043 A1 | 10/2021 | Birner et al. | |
| 2021/0376148 A1 | 12/2021 | Lee | |

OTHER PUBLICATIONS

Elkashlan, R. Y. et al; "Analysis of Gate-Metal Resistance in CMOS-Compatible RF GaN HEMTs"; IEEE Trans. on Electron Devices, vol. 67, No. 11; 5 page (Nov. 2020).

Green, B. M. et al; "A High Power Density 26 V GaAs pHEMT Technology"; IEEE MTT-S Int'l Microwave Symposium Digest, Fort Worth, TX, US; 4 pages (2004).

Lee, Kiwon et al; "Improved DC and RF Performance of High Power AlGaN/GaN HEMTs with a Novel Inner Field-plate"; Proceedings of Asia-Pacific Microwave Conference; 4 pages (2006).

Piel, Pierre-Marie et al; "A 26 Volts, 45 Watts GaAs pHEMT for 2 GHz WCDMA Applications"; IEEE MTT-S Int'l Microwave Symposium Digest; Fort Worth, Texas, US; 4 pages (2004).

Xie, Gang et al; "Breakdown Voltage Enhancement for Power AlGaN/GaN HEMTs with Air-bridge Field Plate"; 24th Int'l Symposium on Power Semiconductor Devices and ICs, Bruges, BE; 2 pages (Jun. 2012).

U.S. Appl. No. 17/561,793, filed Dec. 24, 2021, 51 pages.

U.S. Appl. No. 17/561,796, filed Dec. 24, 2021, 51 pages.

Notice of allowance; U.S. Appl. No. 17/645,290 10 pages Feb. 14, 2025.

Non Final Office Action; U.S. Appl. No. 17/645,290; 19 pages (Aug. 30, 2024).

Notice of Allowance; U.S. Appl. No. 17/645,286; 10 pages (Aug. 26, 2024).

Non Final Office Action; U.S. Appl. No. 17/645,280; 14 pages (Jan. 16, 2025).

* cited by examiner ness and overlying the channel region; a first interlayer dielectric material overlying the channel and the first electrode; and second interlayer dielectric material overlying the first interlayer dielectric material.

TRANSISTORS WITH SOURCE-CONNECTED FIELD PLATES

FIELD OF THE INVENTION

Embodiments of the subject matter described herein relate generally to semiconductor devices with conductive elements and methods for fabricating such devices.

BACKGROUND OF THE INVENTION

Semiconductor devices find application in a wide variety of electronic components and systems. High power, high frequency transistors find application in radio frequency (RF) systems and power electronics systems. Gallium nitride (GaN) device technology is particularly suited for these RF power and power electronics applications due to its superior electronic and thermal characteristics. In particular, the high electron velocity and high breakdown field strength of GaN make devices fabricated from this material ideal for RF power amplifiers and high-power switching applications. Field plates are used to reduce gate-drain feedback capacitance and to increase device breakdown voltage in high frequency transistors. Accordingly, there is a need for semiconductor and, in particular, GaN devices with field plates.

SUMMARY OF THE INVENTION

In an example embodiment, a method of fabricating a semiconductor device is provided. The method includes depositing interlayer dielectric material over a first dielectric layer and a first electrode on a semiconductor substrate. The first dielectric layer is disposed above a channel region of the semiconductor substrate suitable for use as a semiconductive transistor channel; the first electrode extends within a first aperture in the first dielectric layer and contacts a top surface of the channel region within the aperture; and the first electrode is disposed between a first current terminal electrically coupled to a first end of the channel region and a second current terminal electrically coupled to a second end the channel region opposite the first end of the channel region.

The method further includes performing a first patterning step that includes selectively removing the interlayer dielectric material in a first region between the first electrode and the second current terminal, thereby leaving remaining dielectric material that includes the first dielectric material above the channel region. The method also includes forming a second electrode in the first region having first and second ends. The first end of the second electrode is adjacent to the first electrode. The first end of the second electrode separated from the top surface of the channel region by at least the first dielectric layer. The second end of the second electrode is disposed above the first electrode and is separated from the first electrode by the remaining interlayer dielectric material.

Finally, the method further includes forming a conductive interconnect that extends between the first current terminal and the second electrode and electrically couples the second electrode to the first current terminal. The interconnect is disposed above the first electrode and the remaining interlayer dielectric material.

In another example embodiment, a semiconductor device is provided. The device includes a channel region defined in a semiconductor substrate; a first current terminal electrically coupled to a first end of the channel region; and a second current terminal electrically coupled to a second end of the channel region opposite the first end. The device also has a first dielectric material having a first dielectric thickness and overlying the channel region; a first interlayer dielectric material overlying the channel and the first electrode; and second interlayer dielectric material overlying the first interlayer dielectric material.

The device has a first aperture in the first dielectric material that overlies the channel region in between the first current terminal and the second current terminal; and an electrically conductive first electrode that extends within the first aperture that is in direct physical contact with a top surface of the channel region. The device also has an electrically conductive second electrode spaced apart from the first electrode.

The second electrode has a first end that overlies at least the first dielectric material and the channel region at a location between the first electrode and the second current terminal; and a second end that overlies at least a portion of the first electrode that is separated from the first electrode by the first and second interlayer dielectric materials. The device is configured to provide an electrically conductive path from the first current terminal to the second current terminal via the channel region when a sufficient control voltage is applied to the first electrode.

BRIEF DESCRIPTION OF THE DRAWINGS

The present disclosure is illustrated by way of examples, embodiments and the like and is not limited by the accompanying figures, in which like reference numbers indicate similar elements. Elements in the figures are illustrated for simplicity and clarity and have not necessarily been drawn to scale. The figures along with the detailed description are incorporated and form part of the specification and serve to further illustrate examples, embodiments and the like, and explain various principles and advantages, in accordance with the present disclosure, wherein.

DETAILED DESCRIPTION

Figure 1:
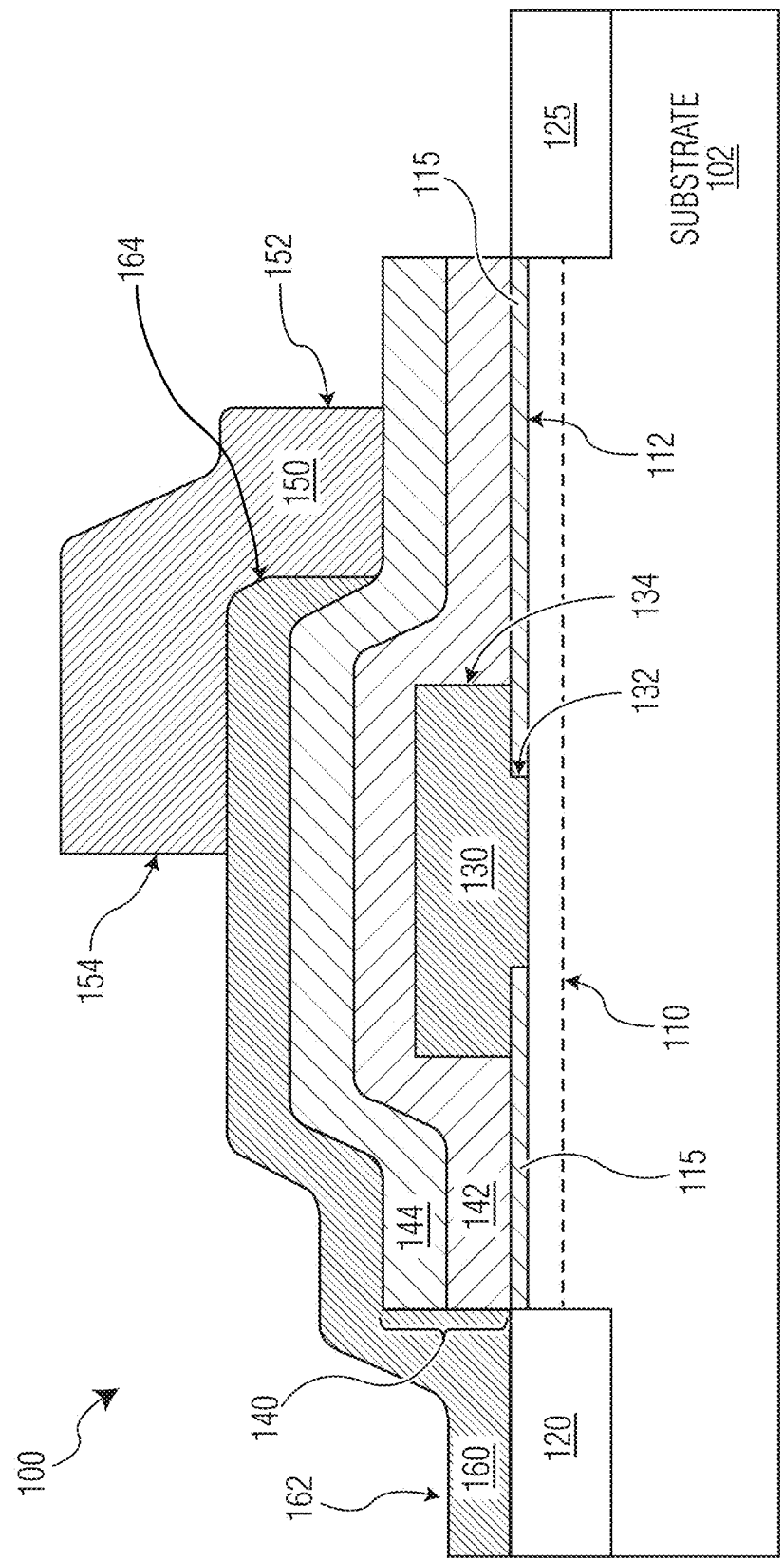
FIG. 1 is a cross-sectional schematic view of an example transistor according to embodiments herein.

The following detailed description is exemplary in nature and is not intended to limit the invention or the application and uses of the same. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements but may include other elements not expressly listed or inherent to such process, method, article, or apparatus. The term "coupled," as used herein, is defined as directly or indirectly connected in an electrical or non-electrical manner. As used herein the terms "substantial" and "substantially" mean sufficient to accomplish the stated purpose in a practical manner and that minor imperfections, if any, are not significant for the stated purpose.

Directional references such as "top," "bottom," "left," "right," "above," "below," and so forth, unless otherwise stated, are not intended to require any preferred orientation, and are made with reference to the orientation of the corresponding figure or figures for purposes of illustration.

FIG. 1 is a cross-sectional schematic view of example transistor 100 provided with a first electrically conductive electrode (a gate electrode 130) and a second electrically conductive electrode suitable for use as a field plate (a field plate 150) according to embodiments herein. The transistor 100 is formed on a semiconductor substrate 102 and has a channel region 110 near a top surface 112 of the substrate 102. The transistor includes a first current terminal 120 electrically coupled to a first end of the channel region 110 and a second current terminal 125 electrically coupled to a second end of the channel region 110 opposite the first current terminal 120. A first dielectric material 115 is disposed on the top surface 112 overlying the channel region 110. The first current terminal 120 and the second current terminal 125 may be formed by any suitable method. For example, they may be appropriately doped regions within the semiconductor substrate 102, or as metallic contacts deposited within recesses in the substrate 102 or on the surface of the substrate 102.

The gate electrode 130 contacts the channel region 110 through an aperture in the first dielectric material 115. As shown, the gate electrode 130 may have a first portion 132 that contacts the channel region 110 within the aperture and optionally has a second portion 134 that overhangs the first dielectric material 115. Although the gate electrode 130 is depicted as having vertical sidewalls, it will be understood that the gate electrode 130 may have any suitable geometry. For instance, the first portion 132 of the gate electrode 130 may have sidewalls that are curved or slanted. Similarly, the second portion 134 of the gate electrode 130 may have sidewalls that are curved or slanted and the top of the gate electrode 130 (farthest from the channel region 110) my have any suitable geometry. The gate electrode 130 is disposed in between the first current terminal 120 and the second current terminal 125 along the length of the channel region 110.

It will be appreciated that the first current terminal 120 may be operated, for example, as a source terminal of the transistor 100 and the second current terminal 125 may be operated, for example, as a drain terminal of the transistor 100. It also be understood that the gate electrode 130 is suitable for use as a gate electrode of the transistor 100 such that, when a suitable bias voltage is applied to the gate electrode 130, the channel region 110 is configured to provide an electrically conductive path between the first current terminal 120 and the second current terminal 125.

Additional dielectric material 140 overlies the gate electrode 130 and various portions of the channel region 110. This additional dielectric material 140 may include a second dielectric material 142 and a third dielectric material 144 as shown in FIG. 1. As shown in FIG. 1, the transistor 100 also includes the field plate 150 with a first end 152 of the field plate 150 disposed above the channel region 110 in between the gate electrode 130 and the second current terminal 125. A second end 154 of the field plate 150 overlies the gate electrode 130. An electrically conductive interconnect 160 has a first end 162 of the interconnect 160 coupled to the first current terminal 120 and a second end 164 of the interconnect 160 that electrically couples the field plate 150 to the first current terminal 120.

It will be understood that, when the first current terminal 120 is operated as a source terminal of the transistor 100, the field plate 150 is configured to operate as source-coupled field plate. In the transistor 100, the conductance of the channel region 110 during operation of the transistor 100 will be influenced by the electrical potential of the gate electrode 130 and the field plate 150. It will be appreciated that the first end 152 of the field plate 150 is capacitively coupled to the channel region 110 across the first dielectric material 115 and the second dielectric material 142. Meanwhile the interconnect 160 is separated from the gate electrode 130 and the channel region 110 by both the dielectric materials 142, 144.

Generally, a source-coupled field plate such as the field plate 150 may be used to reduce gate-to-drain feedback capacitance ("CGD") in transistors such as the transistor 100 when compared to otherwise similar transistors lacking such a field plate. However, the addition of a source-coupled field plate spaced apart from a gate electrode such as the gate electrode 130 will also tend to introduce additional capacitance between the gate and the source ("CGs") which is often an undesirable trade-off. Often, a single dielectric may be deposited over a substrate that has already been provided with a channel region and a gate. In this instance, both the CGD reduction provided by a source field plate and the increased Cos associated with the field plate will depend strongly on the thickness and dielectric properties of that single dielectric layer.

Meanwhile, in the transistor 100 the use of multiple dielectric layers configured as described may confer certain advantages. Specifically, the relative dielectric constants and thicknesses of each of these materials may be chosen to achieve desired performance characteristics and to facilitate various fabrication procedures in embodiments herein, such as mixing use of oxide and nitride materials with different dielectric constants and etch selectivity. For instance, in the example of FIG. 1, the relative thicknesses and dielectric constants of the first dielectric material 115 and the second dielectric material 142 will tend to determine the effect of the field plate 150 (operating as a source-coupled field plate) on the channel region 110 and CoD of the transistor 100 (i.e., the capacitance between the gate electrode 130 and the second current terminal 125). Meanwhile, the dielectric constants and thicknesses of the third dielectric material 144 together with the second dielectric material 142 will largely determine the addition Cos penalty. Thus, a material with a relatively high dielectric constant may be chosen for the dielectric material 142 to maximize the influence of the field plate 150 on the channel region 110. If the dielectric material 142 was the only material separating the interconnect 160 from the gate electrode 130, the resulting additional Cos might be undesirably large. However, the Cos penalty introduced by the field plate 150 and interconnect 160 overlying the gate electrode 130, can be mitigated by the presence of the additional dielectric material 140 (shown as a composite dielectric stack that includes the dielectric materials 140, 142) in at least two ways. First, the distance between the interconnect 160 and the gate electrode 130 may be increased by the additional thickness added by the dielectric material 144 disposed over the dielectric material 142. Second, the dielectric material 144 may be chosen to have a lower dielectric constant than the dielectric material 142, further reducing unwanted additional CGs.

It will be understood that features of the transistor 100 above (and features of other example transistors herein) may be compatible with various transistor technologies. For instance, the transistor 100 and/or any other example transistor according to embodiments herein may be a metal-MOSFET or MISFET fabricated on a silicon substrate or any other suitable semiconductor substrate. For instance, in some embodiments, the transistor 100 is a III-V compound semiconductor-based high-electron-mobility transistor ("HEMT"), otherwise known as a heterostructure field effect transistor ("HFET"). In such embodiments the effective semiconductor channel may be a 2D electron gas ("2DEG") formed at a semiconductor heterojunction disposed with the channel region 110 according to known techniques. In some embodiments, the transistor 100 may be a gallium-nitride (GaN) based HEMT. In some such embodiments, a 2DEG is formed at an interface between a GaN layer and an aluminum doped layer with a stochiometric composition described by the chemical formula $Al_xGa_{1-x}N$. In such embodiments it will be understood that the effective channel may be buried within the channel region 110 and may not extend to the top surface 112 of the substrate above the channel region 110. In some embodiments, the first dielectric material 115 may be a material that provides surface passivation for the channel region 110. For instance, the first dielectric material 115 may be a silicon nitride passivation layer over a GaN-based heterostructure. It will be further understood that, in embodiments where a channel region such as the channel region 110 is formed by a semiconductor heterostructure, that the top surface of a semiconductor substrate (e.g., the substrate 102) will be defined herein for the purposes of discussion as a top surface of this heterostructure.

Figure 2:
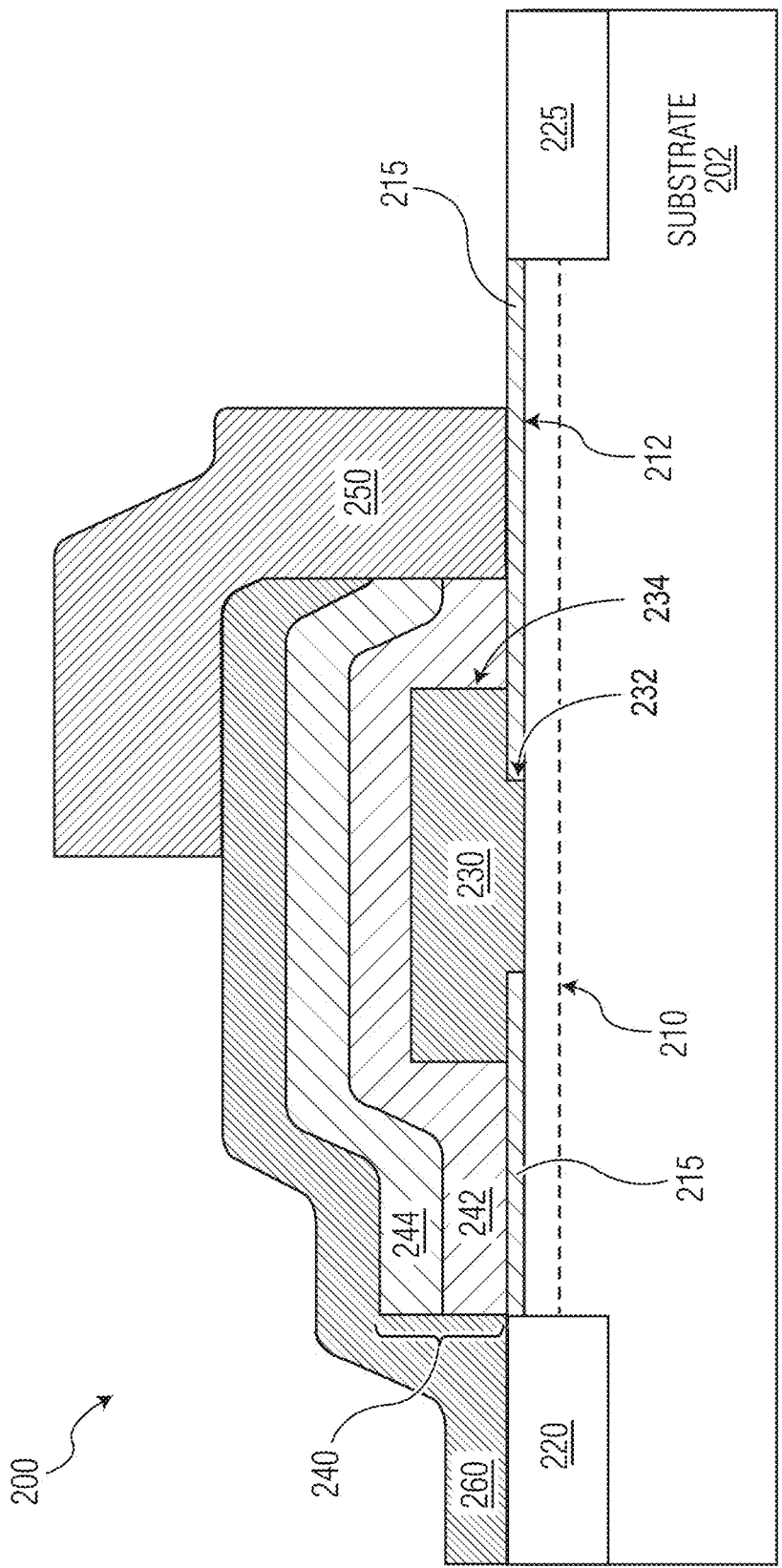
FIG. 2 is a cross-sectional schematic view of another example transistor according to embodiments herein.

FIG. 2 is a cross-sectional schematic view of example transistor 200 according to embodiments herein that is a variation of the example transistor 100. Similarly, to the transistor 100, the transistor 200 is formed on a semiconductor substrate 202 (e.g., the substrate). The transistor 200 has a channel region 210 (e.g., the channel region 110) coupled to a first current terminal 220 and a second current terminal 225 (e.g., the current terminals 120,125) with a first electrically conductive electrode (a gate electrode 230 such as the gate electrode 130) disposed between the two current terminals. The gate electrode 230 (e.g., the gate electrode 130) has a first portion 232 and a second potion 234. The first portion 232 contacts the channel region 210 within an aperture in the dielectric material 215 (e.g., the dielectric material 115). The transistor 200 also includes a second electrically conductive electrode which is suitable for use a source-coupled field plate (a field plate 250, such as the field plate 150) and is electrically coupled to the first current terminal 220 via an electrically conductive interconnect 260 (e.g., the interconnect 160).

Notably, the transistor 200 differs from the transistor 100 in that the field plate 250 is in direct contact with the first dielectric material 215 (e.g., the dielectric material 115) and without an interposing portion of the dielectric 244 (e.g., the dielectric 144). Thus, if all other dimensions and material choices are the same between the transistor 100 and the transistor 200, then the transistor 200 will tend to exhibit lower CGD than the transistor 100 at the cost of a relatively small increase in Cos resulting from increased overlap of the field plate 250 with the gate electrode 230 (when the field plate 250 is operated as a source-connected field plate).

Figure 3:
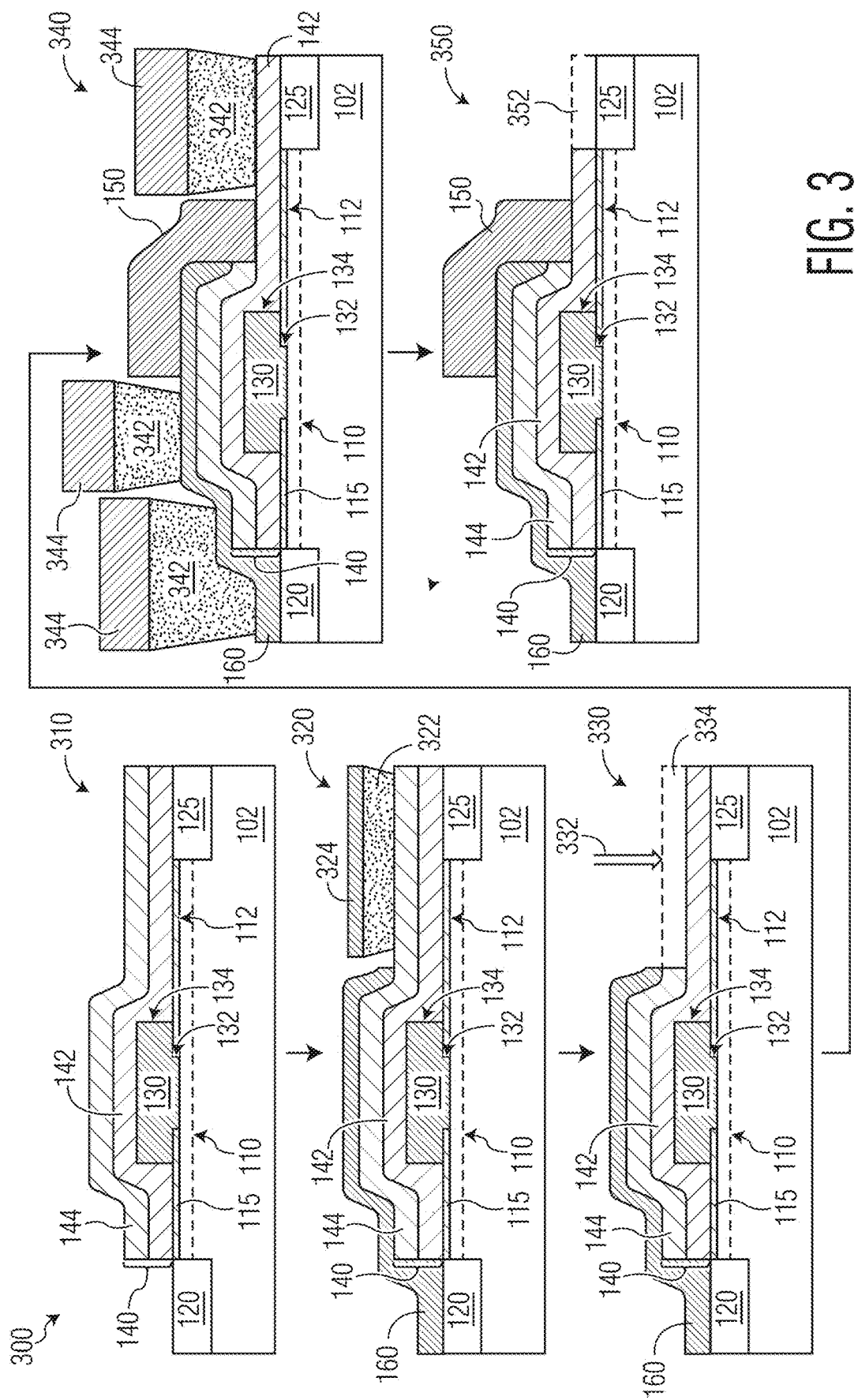
FIG. 3 is cross-sectional schematic illustration of steps in an example process flow that is suitable for use in fabricating the example transistor of FIG. 1 according to embodiments herein.
Figure 4:
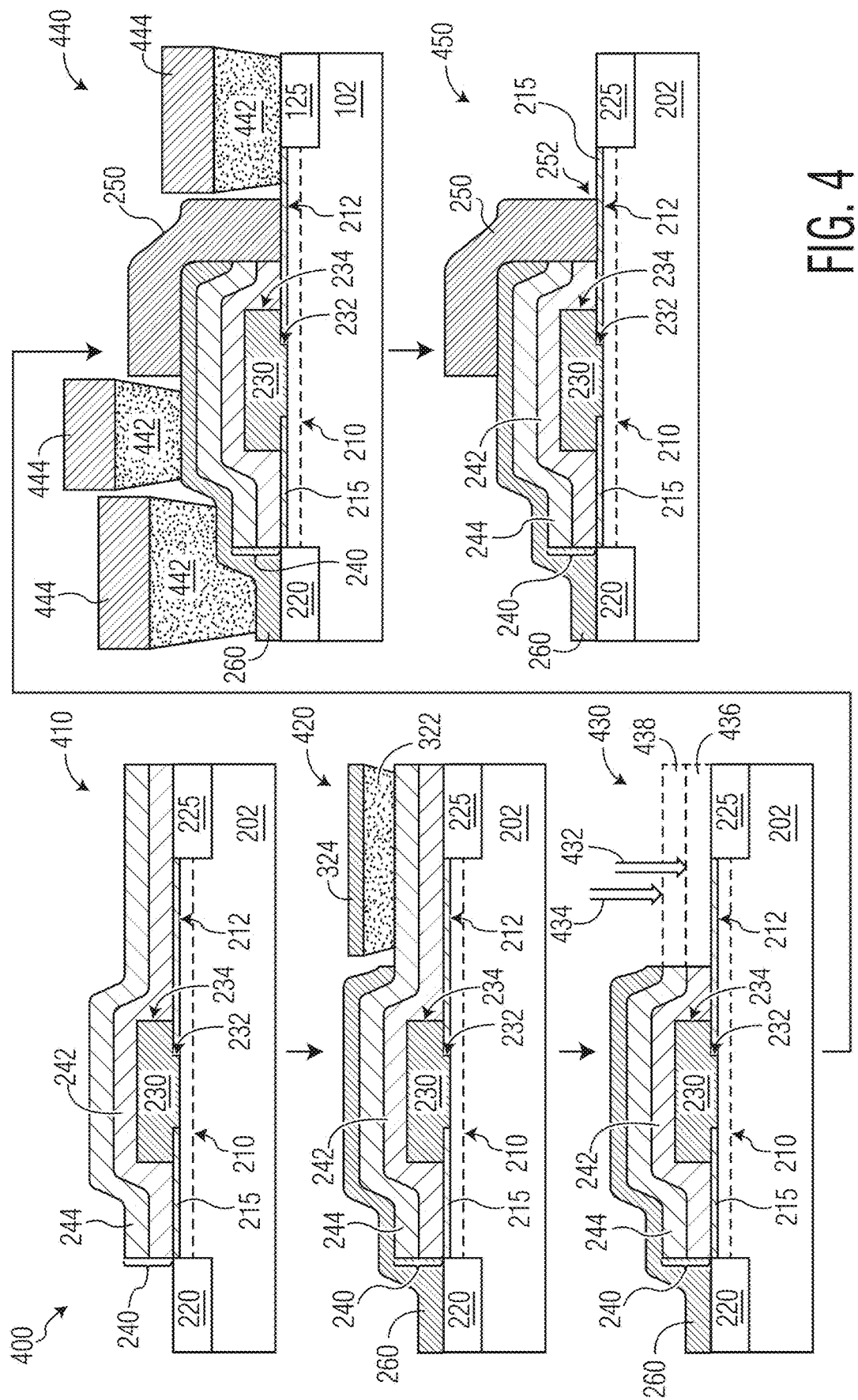
FIG. 4 is cross-sectional schematic illustration of steps in an example process flow that is suitable for use in fabricating the example transistor of FIG. 2 according to embodiments herein.

FIGS. 3-4 illustrate example process flows for fabricating transistors with second electrodes operable as source-coupled field plates according to embodiments herein. FIG. 3 illustrates steps in an example process flow 300 suitable for fabricating the example transistor 100. Meanwhile FIG. 4 illustrates steps in an example process flow 400 suitable for fabricating the example transistor 200. As will be understood from FIG. 3 and FIG. 4 and the descriptions below that the process flow 400 is substantially similar to the process flow 300. Specifically, the two processes differ Thus, transistors with different trade-offs between CGD and Cos may be fabricated from identical starting structures based on whether the process 300 or the process 400 is performed.

As shown in FIG. 3, the example process 300 includes the steps 310, 320, 330, 340, and 350. These steps will be described with reference to the transistor 100 being fabricated during each step. At the outset of the process 300, the substrate 102, is already provided with the channel region 110, the first dielectric material 115, the first and second current terminals 120,125, and the gate electrode 130 extending within the aperture in the dielectric material 115, as described above in connection with FIG. 1.

At step 310 the dielectric materials 142, 144 are patterned above the channel region 110 and the gate electrode 130, leaving the first current terminal 120 uncovered. The dielectric layers 142,144 may be formed and patterned according to any suitable additive or subtractive method. In one example, the dielectric layers are sequentially deposited over the entire portion of the substrate 102 pictured. The dielectric materials 142,144 may then be covered by an etch mask material (such as photoresist) that protects the dielectric materials in areas where the dielectric materials are not to be removed. The dielectric material is then removed from the exposed areas using any suitable etch processes (e.g., one or more wet chemical etching and/or dry plasma etching steps). In another example, photoresist or other sacrificial material is patterned such that areas where the dielectric materials 142, 144 are to remain are exposed, and areas where the dielectric materials 142, 144 are not desired are protected. The dielectric materials are then deposited by any suitable process (e.g., RF sputtering, chemical vapor deposition, physical vapor deposition, atomic layer deposition, etc.). The undesired dielectric material is then removed in a lift-off process that dissolves the sacrificial material underneath the dielectric materials in areas where the dielectric materials are not desired.

At step 320, conductive material that will form the interconnect 160 once patterned. An additive lift-off process is pictured in which sacrificial material 322 (e.g., photoresist) has been patterned on the substrate 102. Conductive material is deposited by any suitable process (e.g., sputtering, thermal, electron beam evaporation, thermal evaporation, etc.) over areas covered by the sacrificial material 322 and exposed areas free of the sacrificial material 322. The sacrificial material 322 is dissolved, removing the conductive material 324 with it and leaving the interconnect 160 behind as shown at step 330. Although an additive lift-off process is depicted for the formation of the interconnect 160, it should be understood that well-known subtractive processes may also be suitable.

At step 330, the interconnect 160 is used as an etch mask to protect the dielectric materials 142, 144 from being removed above the gate electrode 130 and the region between the gate electrode 130 and the current terminal 120. The dielectric material 144 is selectively removed from the area unprotected by the interconnect 160. In some examples, the dielectric materials 142,144 are chosen such that the dielectric material 144 is preferential removed by a chosen etching process (e.g., any suitable wet chemical etch, or dry plasma etch symbolized by the arrow 332).

In one or more examples the dielectric material 142 is an oxide material (including silicon oxides and aluminum oxides as non-limiting examples) and the dielectric material 144 is a nitride material (including silicon nitrides as non-limiting examples). In such examples, a reactive ion etching process using fluorinated compounds may be used to selectively remove only the dielectric material 144 and/or to remove the dielectric material 144 at a significantly faster rate than the dielectric material 142 (note that the area from which the dielectric 144 has been corresponds to the dashed region 334). In some examples the area may be "overetched" to tune the residual thickness of the dielectric material 142 that remains. That is, the etch process chosen to remove the dielectric material 144 may be prolonged past the point where all the dielectric material 144 has been removed and the remaining thickness of the dielectric material 142 may be controlled by varying how long the etch time is extended beyond the time required to remove the dielectric material 144). As explained above in connection with FIG. 1 and further below, in connection with step 340, the thickness of the dielectric material 142 under the field plate 150 is one factor that determines the CGD reduction (compared to a device with no source field plate) enabled by the field plate 150.

In one or more other examples, the dielectric material 142 is a nitride material (inducing silicon nitrides as non-limiting examples) and the dielectric material 144 is an oxide material (including silicon oxides and aluminum oxides as non-limiting examples).

At step 340, conductive material that will form the field plate 150 is patterned. An additive lift-off process is pictured in which sacrificial material 342 (e.g., photoresist) has been patterned on the substrate 102. Conductive material is deposited by any suitable process (e.g., sputtering, thermal, electron beam evaporation, thermal evaporation, etc.) over areas covered by the sacrificial material 342 and exposed areas free of the sacrificial material 342. The sacrificial material 322 may be dissolved, removing the conductive material 344 with it and leaving the field plate 150 behind as shown at step 340. Although an additive lift-off process is depicted for the formation of the field plate 150, it should be understood that well-known subtractive processes may also be suitable.

Finally, at step 350, after the sacrificial material 342, and with it, the undesired conductive material 344 is removed, the dielectric material 142 remaining above the current terminal 125 (indicated by the dashed area 352) is optionally removed to allow for the addition of a conductive via in electrical contact with the current terminal 125.

As shown in FIG. 4, the example process 400 includes the steps 410, 420, 430, 440, and 450. These steps will be described with reference to the transistor 100 being fabricated during each step. At the outset of the process 400, the substrate 202 is already provided with the channel region 210, the first dielectric material 215, the first and second current terminals 220, 225, and the gate electrode 230 extending within the aperture in the dielectric material 215, as described above in connection with FIG. 2.

At step 410 (e.g., step 310 of process 300) the dielectric materials 242,244 are patterned above the channel region 210 and the gate electrode 230, leaving the first current terminal 220 uncovered. The dielectric materials 242,244 may be formed and patterned according to any suitable additive or subtractive method, as described above in connection with step 310 of the process 300.

At step 420 (e.g., step 320 of process 300), conductive material that will form the interconnect 260 once patterned is deposited, as described above in connection with step 320 of the process 300. An additive lift-off process is pictured in which sacrificial material 422 (e.g., sacrificial material 322) has been patterned on the substrate 202 as described in connection with step 320 of the process 300. The sacrificial material 422 is removed, removing the conductive material 424 (e.g., the conductive material 324) with it and leaving the interconnect 260 behind as shown at step 430. Although an additive lift-off process is depicted for the formation of the interconnect 260, it should be understood that well-known subtractive processes may also be suitable.

At step 430, the interconnect 260 is used as an etch mask to protect the dielectric materials 242, 244 from being removed above the electrode 230 and the region between the electrode 230 and the current terminal 220. The dielectric material 244 is selectively removed from the area unprotected by the interconnect 260 as described above in connection with step 330 of the process 300. However, in contrast to the corresponding step 330 of process 300, step 430 includes removing both layers of the dielectric material 244,242 (e.g., the dielectric materials 144, 142). The dashed regions 438, 436 indicate the areas from which the dielectric material has been removed. In some examples, the dielectric materials 242,244 are chosen such that the dielectric material 244 is preferentially removed by a chosen etching process (e.g., any suitable wet chemical etch, or dry plasma etch) such that etching of the dielectric material 242 proceeds more slowly than etching of the dielectric material 244. In some embodiments two distinctive etch processes are used: a first etch process 432 (symbolized by a vertical arrow) that removes the dielectric material 244 and a subsequent optional etch process 434 removes the dielectric material 242. In some such embodiments, the subsequent etch used to remove the dielectric material 242 is a wet etch process. In embodiments in which the dielectric material 215 (e.g., the dielectric material 115) is a thin material (e.g., silicon nitride having a thickness less than 1000 Angstroms) that passivates the top surface 212 above the channel region 210, wet etching may be desirable to avoid etch-induced damage to the dielectric material 215 which might adversely affect performance of the transistor 200 (e.g., by introducing charge-trapping states in the semiconductor band structure of the channel region 210).

At step 440 (e.g., step 340 of process 300), conductive material that will form the field plate 250 is patterned similarly to the description of step 340 of process 300. An additive lift-off process is pictured in which sacrificial material 442 (e.g., the sacrificial material 342) has been patterned on the substrate 202. Conductive material is deposited by any suitable process (e.g., sputtering, thermal, electron beam evaporation, thermal evaporation, etc.) over areas covered by the sacrificial material 442 and exposed areas free of the sacrificial material 442. The sacrificial material 442 may be dissolved, removing the conductive material 444 with it and leaving the field plate 250 behind as shown at step 450. Although an additive lift-off process is depicted for the formation of the field plate 250, it should be understood that well-known subtractive processes may also be suitable.

Finally, at step 450, after the sacrificial material 442, and with it, the undesired conductive material 444 is removed, the dielectric material 244 remaining above the current terminal 225 is optionally removed to allow for the addition of a conductive via in electrical contact with the current terminal 225.

In the processes 300,400 respective interconnects (e.g., interconnects 160,260) are used. as an etch mask that at least partially defines the location of subsequently formed field plates 150,250 configured for operation as source-connected field plates that are disposed, in part, above the interconnects 160,260. In embodiments described below in connection with FIGS. 5-8, electrodes similar to the field plates 150,250 are disposed (at least partially below) interconnects similar to the interconnects 160, 260.

Figure 5:
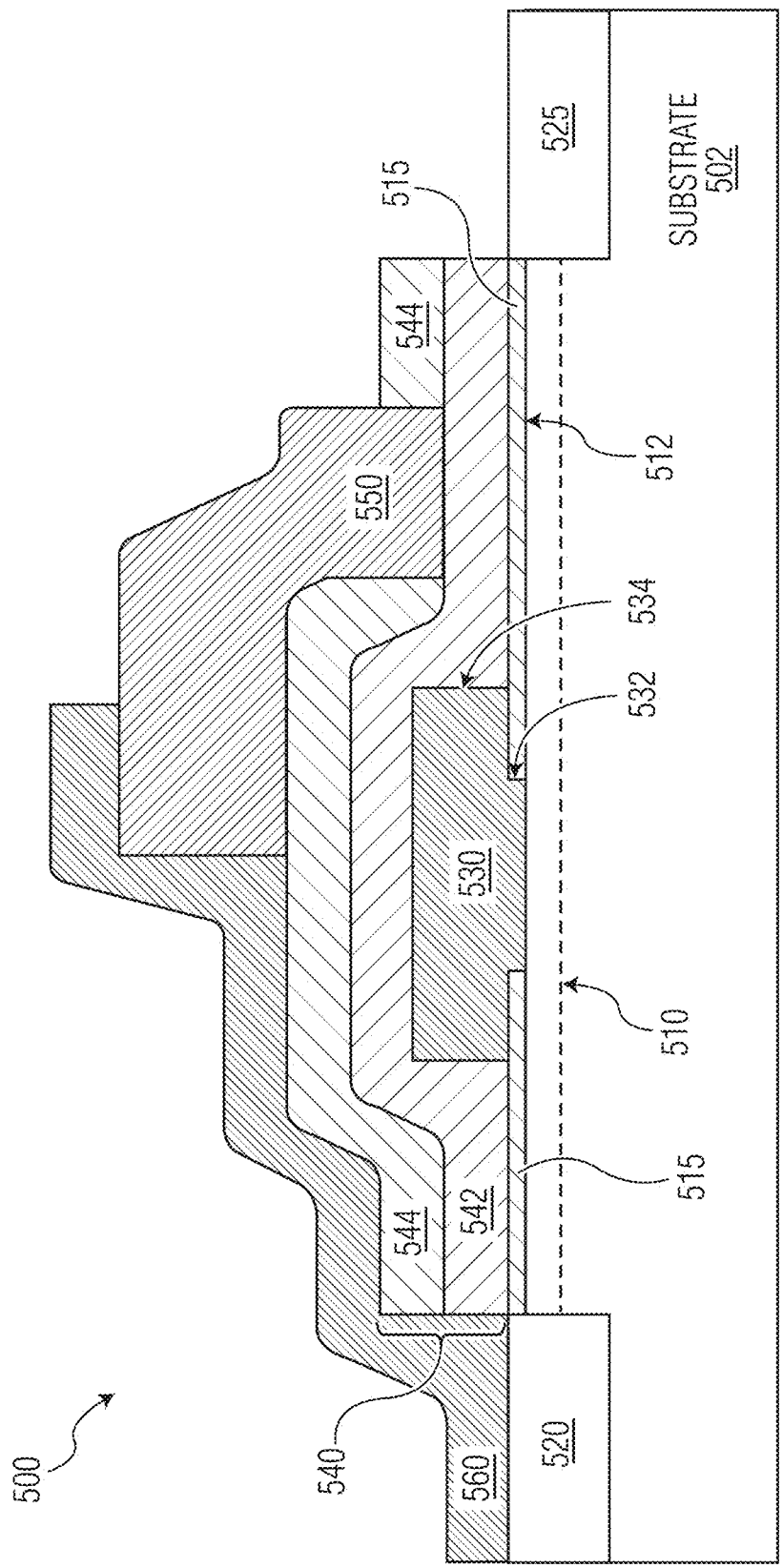
FIG. 5 is a cross-sectional schematic view showing additional features of a transistor related to the transistor of FIG. 1 according to embodiments herein.

FIG. 5 is a cross-sectional schematic view of example transistor 500 according to embodiments herein that may be understood as a variation of the example transistor 100. Similarly to the transistor 100, the transistor 500 is formed on a semiconductor substrate 502 (e.g., the substrate 102). The transistor 500 has a channel region 510 (e.g., a channel region 110,210) coupled to a first current terminal 520 and a second current terminal 525 (e.g., current terminals 120, 125 or 220,225) with a gate electrode 530 (e.g., a gate electrode 130,230) disposed between the two terminals. The gate electrode 530 has a first portion 532 and a second potion 534 (e.g., a first portion 132,232 and/or a second portion 134,234 of a respective gate electrode 130,230). The first portion 532 contacts the channel region 510 within an aperture in the dielectric material 515 (e.g., dielectric material 115,215). The transistor 500 also includes a second electrode which is suitable for use a source-coupled field plate (a field plate 550; e.g., a field plate 150,250) and is electrically coupled to the first current terminal 520 via an electrically conductive interconnect 560 (e.g., an interconnect 160,260). In one or more embodiments, the field plate 550 may extend all the way to the current terminal 520 in or more areas (e.g., in the cross-sectional plane depicted or in a different cross-sectional plane) and the separate interconnect 560 may be absent. As shown, the transistor 500 also includes additional dielectric material 540 which includes dielectric material 542 and 544 (e.g., additional dielectric material 140 or 240).

Figure 6:
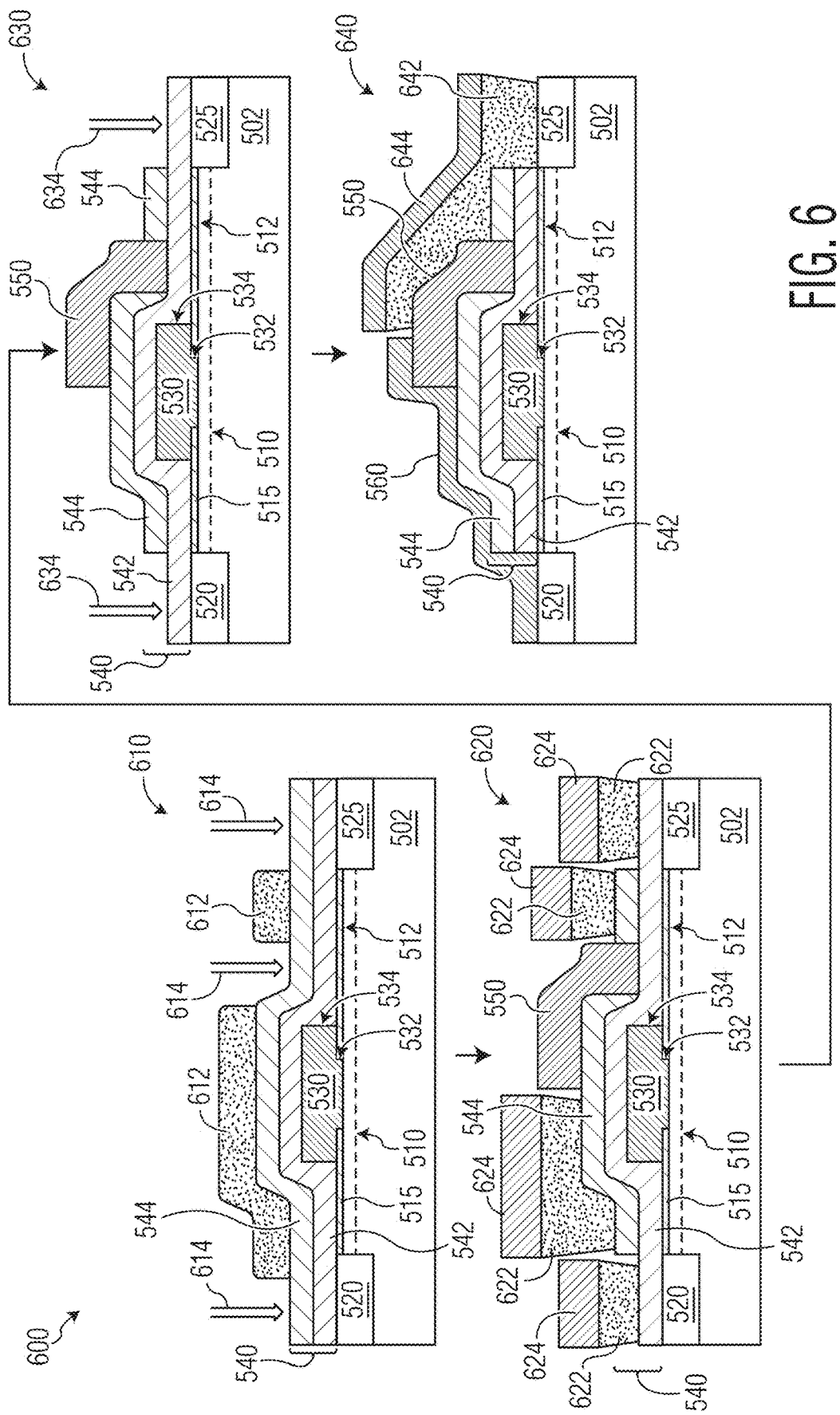
FIG. 6 is cross-sectional schematic illustration of steps in an example process flow that is suitable for use in fabricating the example transistor of FIG. 5 according to embodiments herein.

As shown in FIG. 6, the example process 600 includes the steps 610, 620, 630, and 640. These steps will be described with reference to the transistor 500 being fabricated during each step. At the outset of the process 600, the substrate 502 is already provided with the channel region 510, the first dielectric material 515, the first and second current terminals 520, 525, and the gate electrode 530 extending within the aperture in the dielectric material 515, as described above in connection with FIG. 1.

At step 610, etch masking material 612 is patterned above the dielectric materials 544, 542 and etch process 614 (signified by vertical arrows) configured to selectively remove the dielectric material 544 is performed. The etch masking material 612 may be any suitable material configured to withstand the etch process 614 configured to selectively remove the dialectic material 544. The etch masking material 612 may be patterned using any suitable additive or subtractive process including examples described herein and/or other well-known techniques. As a result of step 610, the dielectric material 544 is patterned above the channel region 510, the current terminals 520, 525 and the gate electrode 530, thereby exposing the dielectric material 542 above the current terminals 520,525 creating an aperture in the dielectric material 544 for the field plate 550, as visible at step 620 in FIG. 6. In one more embodiments, the process 600 may be altered such that the field plate 550 extends all the way to the current terminal 520 in or more areas (e.g., in the cross-sectional plane depicted or in a different cross-sectional plane) and the separate interconnect 560 may be absent.

It will be understood that the etch process 614 is chosen, at least in part, for compatibility with other materials (i.e., the dielectric material 542 and the masking material 612). In one non-limiting example, the dielectric material 542 is an oxide material such as silicon oxide ($SiO_2$ or $SiO_x$ where x is a fractional value that is less than or greater than two) or aluminum oxide ($Al_2O_3$ or $Al_2O_x$ where x is a value other than three), the dielectric material 544 is a nitride material such as silicon nitride ($Si_3N_4$ or $Si_3N_x$ where x is value other than four), and the masking material 612 is photoresist. In one instance, the etch process 614 may be a wet chemical etch that preferentially removes the dielectric material 544 over the dielectric material 542 and the etch mask material 612 such as a wet etching process that uses a buffered oxide etchant (BOE) solution. In another instance, a dry plasma etching process such as a fluorine-based reactive ion etching process (using $SF_4$, as one non-limiting example) may be used.

At step 620 conductive material that will form the field plate 550 once patterned is deposited. An additive lift-off process is pictured in which sacrificial material 622 (e.g., sacrificial material 322 or other suitable material) has been patterned on the substrate 502. The sacrificial material 612 is removed, removing the conductive material 624 with it, leaving the field plate 550 behind as shown at step 630. Although an additive lift-off process is depicted for the formation of the electrode field plate 550, it should be understood that well-known subtractive processes may also be suitable in which a layer is deposited and patterned by etching material that is not protected by an etch mask is removed by a suitable wet chemical or dry plasma etching process. In one more embodiments, step 620 is altered the field plate 550 extends all the way to the current terminal 520 in or more areas (e.g., in the cross-sectional plane depicted or in a different cross-sectional plane).

At step 630, an etch process 634 (signified by arrows) is performed. The etch process 634 is configured to selectively remove the dielectric material 542 that is not protected by the dielectric material 544, as patterned at step 610. Any suitable etch process may be used, including wet chemical etches and dry plasma etches. It will be understood that the choice of etching process for the etch process 634 may depend on choices for various other materials (e.g., the dielectric materials 515, 544 and the conductive material used for the field plate 550). In one or more examples, the dielectric material 542 may be an oxide material (non-limiting examples of which include an aluminum oxide material or a silicon oxide material) and the dielectric material 544 may be a nitride material (e.g., a silicon nitride material). In these and other examples, a reactive ion etching process using fluorinated gases (including hydrofluorocarbons as non-limiting examples) may be used to preferentially remove the nitride materials while leaving oxide materials intact.

At step 640, conductive material that will form the interconnect 560 once patterned is deposited, as described above in connection with steps 320, 420 of the processes 300,400 respectively. An additive lift-off process is pictured in which sacrificial material 642 (e.g., sacrificial material 322) has been patterned on the substrate 502 as described in connection with step 320 of the process 300. The sacrificial material 642 is removed, removing the conductive material 644 (e.g., the conductive material 324) with it, leaving the interconnect 560. Although an additive lift-off process is depicted for the formation of the interconnect 560, it should be understood that well-known subtractive processes may also be suitable (e.g., blanket metal deposition, followed by photolithographic patterning of an etch mask such as depicted by the patterned etch mask 612 in step 610). In one more embodiments in which step 620 is altered such the field plate 550 extends all the way to the current terminal 520 in or more areas (e.g., in the cross-sectional plane depicted or in a different cross-sectional plane), step 640 may not be required.

Figure 7:
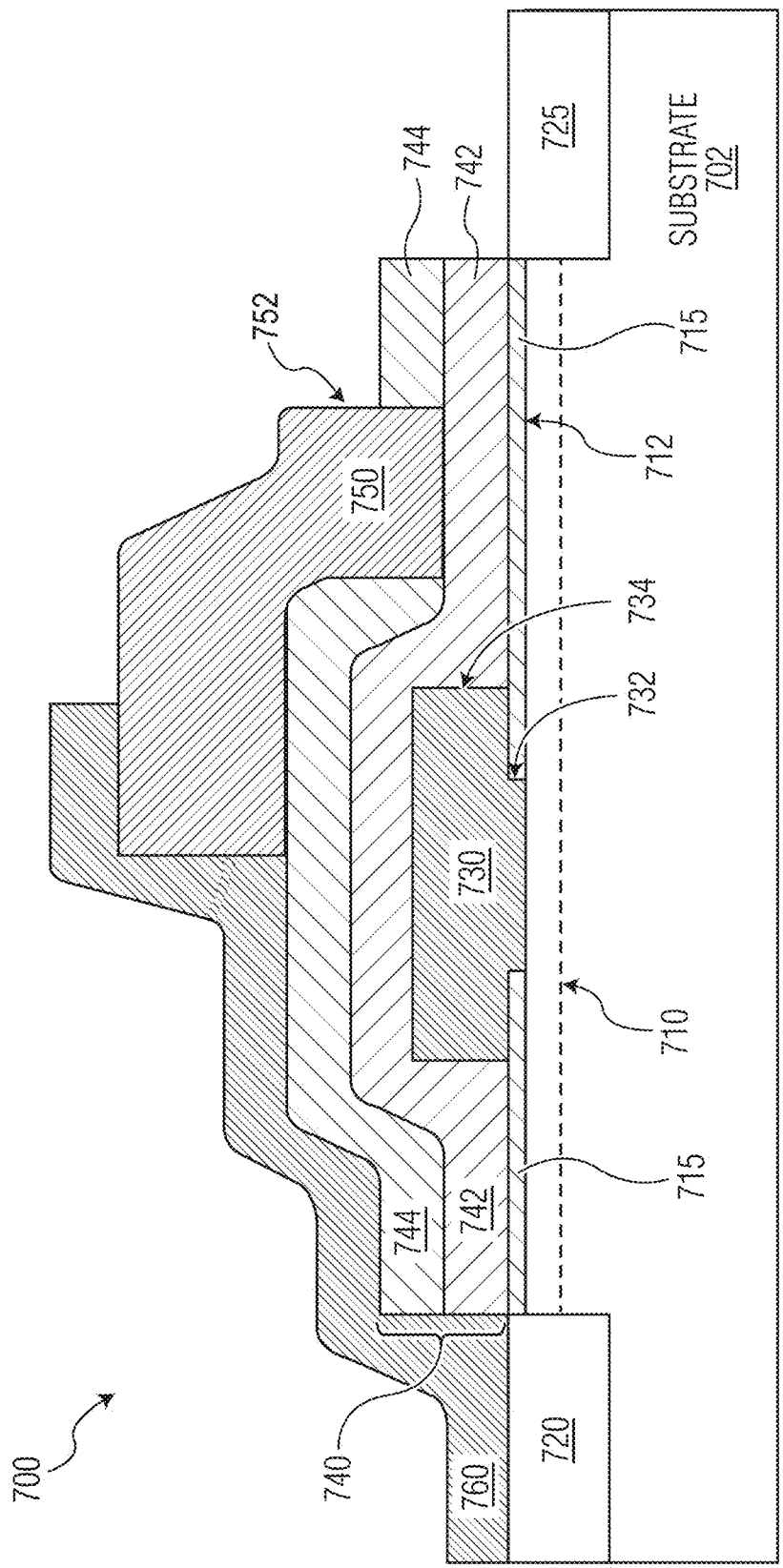
FIG. 7 is a cross-sectional schematic view of another example transistor according to embodiments herein.

FIG. 7 is a cross-sectional schematic view of example transistor 700 according to embodiments herein that may be understood as a variation of the example transistor 500 in which the source-connected field plate (the field plate 750) directly contacts the dielectric material 715 (e.g., dielectric material 115, 215, 515) rather than an intervening dielectric layer (e.g., the dielectric material 544) as seen in the transistor 500 as depicted in FIG. 5.

Similarly, to the transistor 500, the transistor 700 is formed on a semiconductor substrate 702 (e.g., a substrate 102,202,502). The transistor 700 has a channel region 710 beneath a top surface 712 of the substrate 702 (e.g., a channel region 110, 210, 510 coupled to a first current terminal 720 and a second current terminal 725 (e.g., current terminals 120,125, 220,225, and/or 520,525) with a gate electrode 730 (e.g., an electrode 130,230,530) disposed between the two terminals. The gate electrode 730 has a first portion 732 and a second portion 734 (e.g., a first portion 132,232,532 and/or a second portion 134,234,534 of a respective electrode 130,230,530). The first portion 732 contacts the channel region 710 within an aperture in the dielectric material 715 (e.g., dielectric material 115,215, 515). The transistor 700 also includes the second electrode which is suitable for use a source-coupled field plate (a field plate 750; e.g., a field plate 150,250,550) and is electrically coupled to the first current terminal 720 via an electrically conductive interconnect 760 (e.g., an interconnect 160,260, 560). In one or more embodiments, the field plate 750 may extend all the way to the current terminal 720 in or more areas (e.g., in the cross-sectional plane depicted or in a different cross-sectional plane) and the separate interconnect 760 is absent. As shown, the transistor 700 also includes additional dielectric material 740 which includes dielectric material 742 and 744 (e.g., additional dielectric material 140, 240, or 540).

Figure 8:
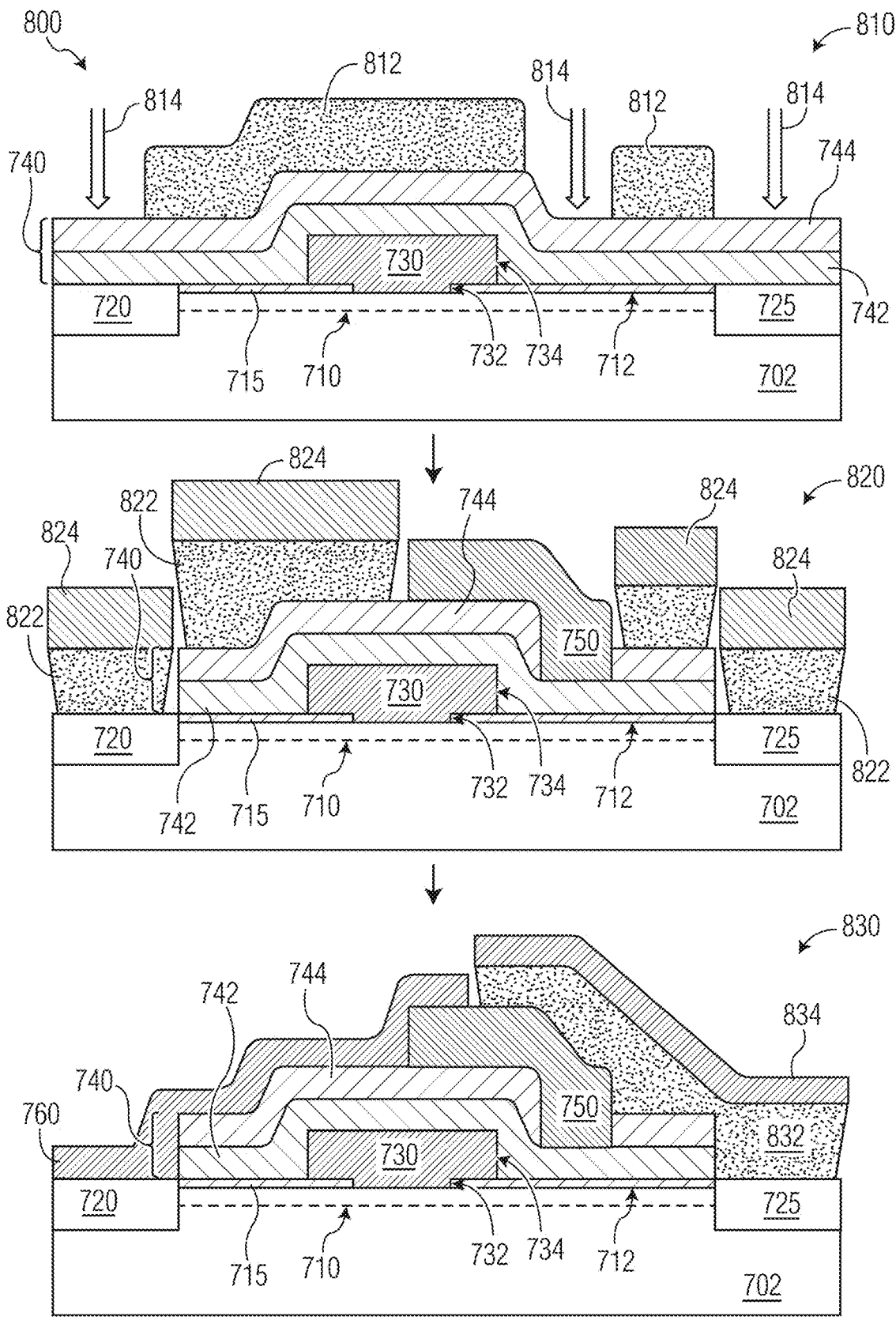
FIG. 8 is cross-sectional schematic illustration of steps in an example process flow that is suitable for use in fabricating the example transistor of FIG. 7 according to embodiments herein.

As shown in FIG. 8, the example process 800 includes the steps 810, 820, and 830. These steps will be described with reference to the transistor 700 being fabricated during each step. At the outset of the process 800, the substrate 702 is already provided with the channel region 710, the first dielectric material 715, the first and second current terminals 720,725 and the gate electrode 730 extending within the aperture in the dielectric material 715, as described above in connection with FIG. 7. It will be apparent that the process 800 has the advantage of requiring few processing steps than the process 600 as will be explained further below. In one or more embodiments, the process 800 may be altered such that the field plate 750 extends all the way to the current terminal 720 in or more areas (e.g., in the cross-sectional plane depicted or in a different cross-sectional plane) and the separate interconnect 760 may be absent.

At step 810, etch masking material 812 is patterned above the dielectric materials 744, 742 and an etch process 814 (signified by vertical arrows) configured to selectively remove the both the dielectric material 744 and the dielectric material 742 is performed. The etch masking material 812 may be any suitable material configured to withstand the etch process 814. The etch masking material 812 may be patterned using any suitable additive or subtractive process including examples described herein and/or other well-known techniques. It will be understood that the etch process 814 will be chosen, at least in part, for compatibility with other materials (i.e., the dielectric material 715 and the etch masking material 812). For instance, the etch process 814 should not cause excessive damage to the dielectric material 715 directly overlying the channel region 710.

In one non-limiting example, the dielectric material 742 is an oxide material (including aluminum oxides and silicon oxides as non-limiting examples), the dielectric material 744 is a nitride material (including silicon nitrides as non-limiting examples), and the etch masking material 812 is any suitable photoresist. In one or more examples, the etch process 814 may be a wet chemical etch that preferentially removes the dielectric material 744 over the dielectric material 742 and the etch mask material (including a wet etch using buffered oxide etchant (BOE) solution, as a non-limiting example). In one a more other examples, a dry plasma etching process (including fluorine-based reactive ion etching processes as non-limiting examples) may be used.

Because the first end 752 of the field plate 750 is disposed directly above the dielectric material 715 in the transistor 700, the process 800 (particularly the step 810) enables the dielectric materials 744, 742 to be removed above both the current terminals 720, 725 at the same time that the opening for the first end 752 of the field plate 750 is made. As a result, the process 800 does not require a step similar to step 640 of the process 600 (in which dielectric material 742 remaining above the current terminal 520 and/or the current terminal 525 must be removed).

At step 820 (e.g., step 620 of the process 600) conductive material that will form the field plate 750 once patterned is deposited. An additive lift-off process is pictured in which sacrificial material 822 (e.g., sacrificial material 322, 622 or other suitable material) has been patterned on the substrate 702. The sacrificial material 822 is removed, removing the unwanted conductive material 824 with and leaving the field plate 750 behind as shown at step 830. Although an additive lift-off process is depicted for the formation of the field plate 750, it should be understood that well-known subtractive processes may also be suitable in which a layer is deposited and patterned by etching material that is not protected by an etch mask is removed by a suitable wet chemical or dry plasma etching process. In one or more embodiments, step 820 is altered such that the field plate 750 extends all the way to the current terminal 720 in or more areas (e.g., in the cross-sectional plane depicted or in a different cross-sectional plane). In one or more such embodiments, the sacrificial material 822 is also absent above the current terminal 725 step 820. In one or more such embodiments, step 830 may be omitted.

At step 830 conductive material that will form the interconnect 760 once patterned is deposited, as described above in connection with steps 320, 420 of the processes 300,400 respectively. An additive lift-off process is pictured in which sacrificial material 832 (e.g., sacrificial material 322, 642) has been patterned on the substrate 702 as described in connection with step 840 of the process 800. The sacrificial material 832 is removed, removing the conductive material 834 (e.g., conductive material 324, 644) with it, leaving the interconnect 760. Although an additive lift-off process is depicted for the formation of the interconnect 760, it should be understood that well-known subtractive processes may also be suitable (e.g., blanket metal deposition, followed by photolithographic patterning of an etch mask such as depicted by the patterned etch mask 612 in step 610).

Figure 9A:
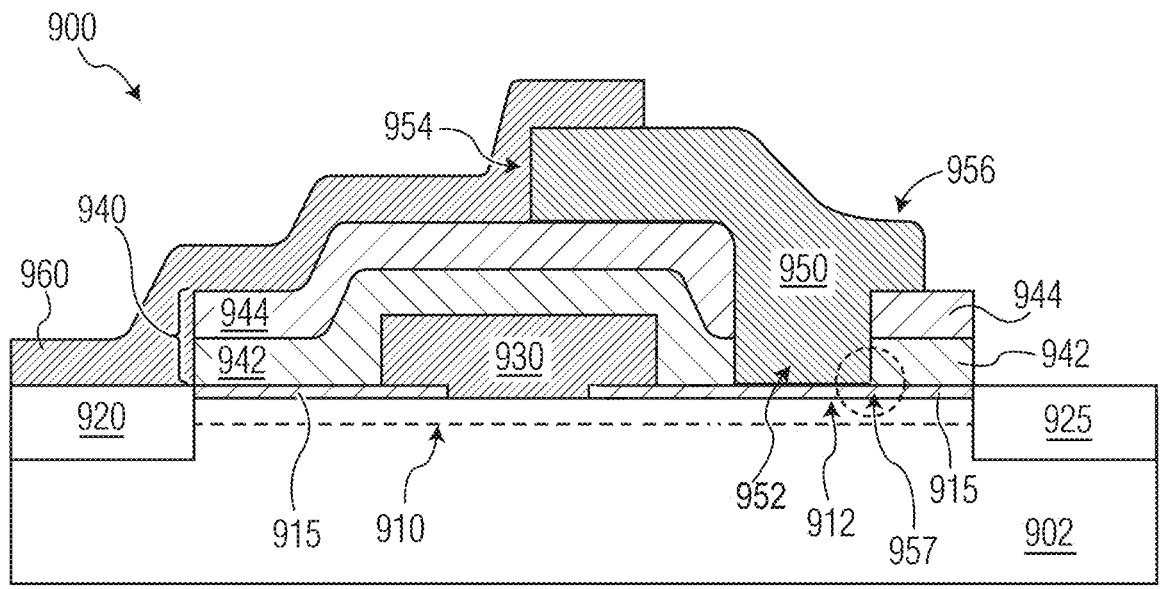
FIG. 9A is a cross-sectional schematic view of another example transistor related to the transistor of FIG. 7 according to embodiments herein.

FIG. 9A is a cross-sectional schematic view of example transistor 900 fabricated on a substrate 902 with a top surface 912 according to embodiments herein in which the electrode operable as a source-connected field plate (the field plate 950; (e.g., a field plate 250, 550, or 750) configured to be operable as a source-connected field plate) is provided with an extension 956 in between a first end 952 and a second end 954 of the field plate 950 that is disposed between the current terminal 925 and the first end 952 of the field plate 950 that is disposed above the channel region 910 and separated from the channel region 910 by the dielectric material 915. It will be appreciated that the extension 956 of the field plate 950 will tend to lower electric fields arising in the vicinity of the dashed region 957 due to the presence of the corner of the field plate 950 nearest the second current terminal 925 (operable as the drain of the transistor 900). As shown, the transistor 900 includes a gate 930 (e.g., a gate 130, 230, 530, or 730).

Figure 9B:
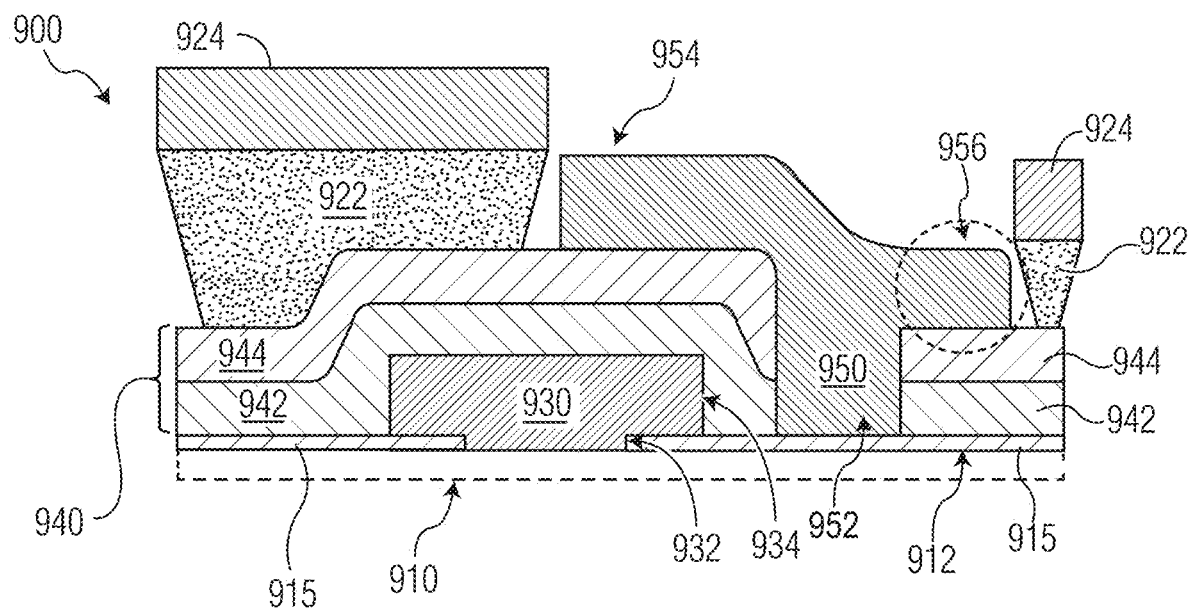
FIG. 9B is cross-sectional schematic illustration an example process step suitable for use in fabricating the transistor of FIG. 9A.

FIG. 9B shows a portion of the transistor 900 during a processing step 920 that is similar to the step 820 of the process 800. The difference in step 920 is that the sacrificial material 922 is patterned such that the extension 956 is disposed above the additional dielectric material 940 (dielectric materials 944, 942).

It will be appreciated that the steps of various processes above are non-limiting examples of suitable processes according to embodiments herein and are for the purposes of illustration. Devices according to embodiments herein may be fabricated using any suitable processes including those that omit steps described above, perform those steps and similar steps in different orders, and the like. As one example, the transistor 500 may be fabricated in a process that exposes the current terminal 520 and 525 in different steps (instead of a single step as shown in step 630).

Figure 10:
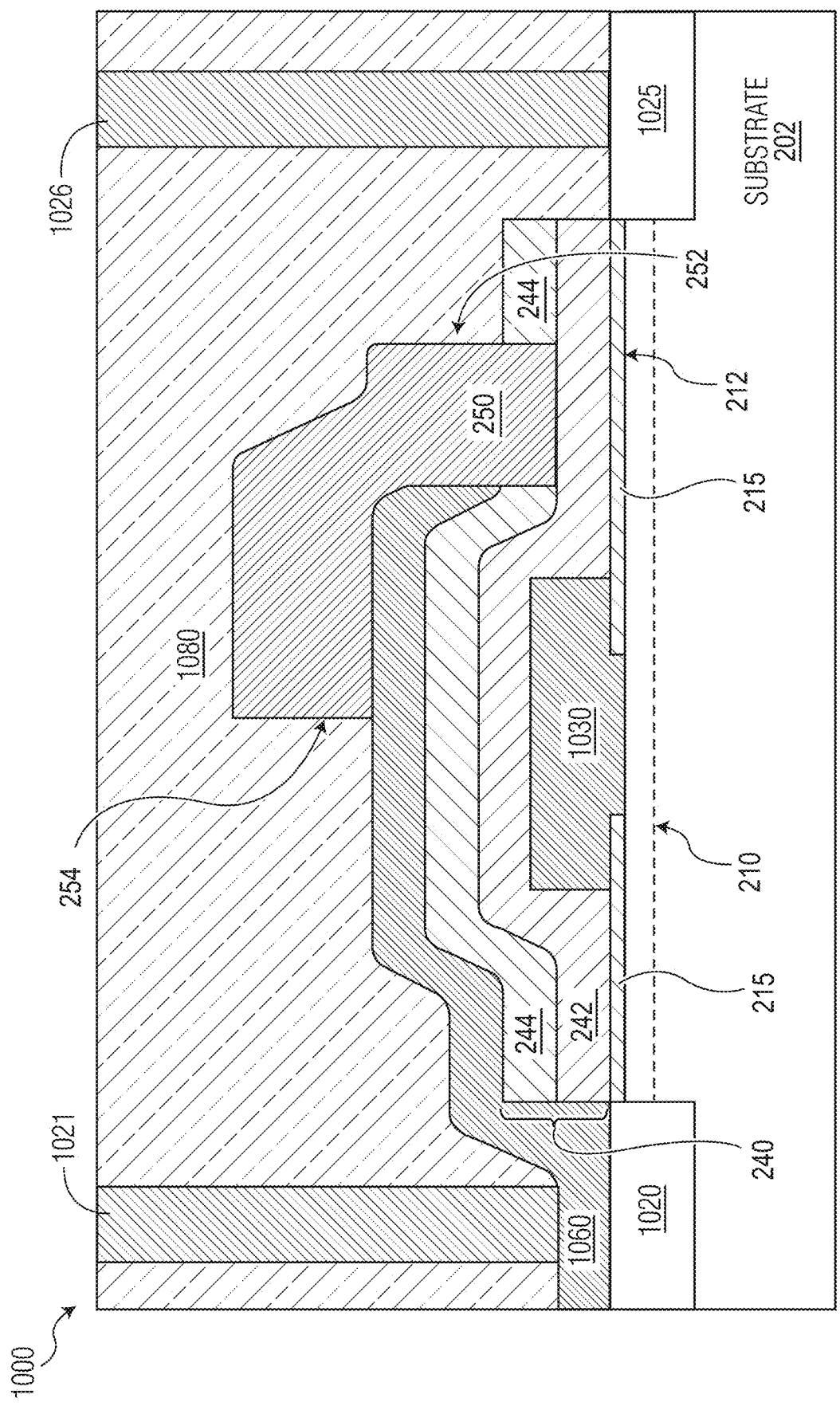
FIG. 10 is a cross-sectional schematic view of another example transistor according to embodiments herein.

It will be appreciated well-known features of transistors may be omitted for clarity. For completeness, FIG. 10 shows a cross-sectional schematic view of a transistor 1000) in which additional dielectric material encapsulates the active structures and provides isolation between vias. Specifically, the transistor 1000 has an isolation dielectric 1080 in which a source via 1021 is disposed that electrically contacts the first current terminal 1020 via the interconnect 1060 and a drain via 1026 that electrically contacts the second current terminal 1025. A gate via electrically contacting the gate electrode 1030 may be present but would not be visible in the cross-sectional plane depicted in FIG. 10. In FIG. 10, features that are similar to features of the transistor 200 not explicitly described in connection with FIG. 10 are labeled with the same reference numbers as in FIG. 2.

EXAMPLES

Features of embodiments may be understood by way of one or more of the following examples:

Example 1: A method of fabricating a semiconductor device that includes depositing interlayer dielectric material over a first dielectric layer and a first electrode on a semiconductor substrate. The first dielectric layer is disposed above a channel region of the semiconductor substrate suitable for use as a semiconductive transistor channel; the first electrode extends within a first aperture in the first dielectric layer and contacts a top surface of the channel region within the aperture; and the first electrode is disposed between a first current terminal electrically coupled to a first end of the channel region and a second current terminal electrically coupled to a second end the channel region opposite the first end of the channel region.

The method further includes performing a first patterning step that includes selectively removing the interlayer dielectric material in a first region between the first electrode and the second current terminal, thereby leaving remaining dielectric material that includes the first dielectric material above the channel region. The method also includes forming a second electrode in the first region having first and second ends. The first end of the second electrode is adjacent to the first electrode. The first end of the second electrode separated from the top surface of the channel region by at least the first dielectric layer. The second end of the second electrode is disposed above the first electrode and is separated from the first electrode by the remaining interlayer dielectric material.

Finally, the method further includes forming a conductive interconnect that extends between the first current terminal and the second electrode and electrically couples the second electrode to the first current terminal. The interconnect is disposed above the first electrode and the remaining interlayer dielectric material.

Example 2: A method as in Example 1, in which the interlayer dielectric material includes a first interlayer dielectric material and a second interlayer dielectric material layer disposed above the first interlayer dielectric material. In this Example, selectively removing the interlayer dielectric material in the first region further includes forming a second aperture in the second dielectric layer by removing the second interlayer dielectric from the first region. In this Example, the first end of the second electrode extends within the second aperture; and the first end of the second electrode is separated from the channel region in the second aperture by the first dielectric material and a portion of the first interlayer dielectric material disposed beneath the second aperture.

Example 3: A method as in Example 2, in which forming the second aperture in the second dielectric layer includes performing an etching procedure that preferentially etches the second interlayer dielectric material over the first interlayer dielectric material for an amount of time chosen to leave a desired thickness of the first interlayer dielectric material intact in the first region.

Example 4: A method as in either of Examples 2 or 3, in which forming the second electrode in the first region includes depositing conductive material that fills the second aperture and also forms an extension area adjacent to the second aperture wherein the conductive material overlies the interlayer dielectric material.

Example 5: A method as in any of Examples 1-4, in which wherein the interlayer dielectric material comprises a first interlayer dielectric material and a second interlayer dielectric material layer disposed above the first interlayer dielectric material. In this Example, selectively removing the interlayer dielectric material in the first region further includes forming a second aperture in the second interlayer dielectric material by removing the second interlayer dielectric material from the first region using a first etching procedure followed by removing the first interlayer dielectric material from the first region using a second etching procedure. In this Example, the first end of the second electrode extends within the second aperture.

Example 6: A method as in any of Examples 2-5 in which forming the second electrode in the first region comprises depositing conductive material that fills the second aperture and also forms an extension area adjacent to the second aperture wherein the conductive material overlies the interlayer dielectric material.

Example 7: A method as in any of Examples 5-6, in which the first etching procedure is a dry plasma etching procedure and the second etching procedure is a wet chemical etching procedure.

Example 8: A method as in any of Examples 5-7 that further includes forming a first via opening that exposes the first current terminal by removing the second interlayer dielectric material from a region above the first current terminal using the first etching procedure followed by removing the first interlayer dielectric material from the region above the first current terminal using the second etching procedure. This Example also includes forming a second via opening that exposes the second current terminal by removing the second interlayer dielectric material from a region above the second current terminal using the first etching procedure followed by removing the first interlayer dielectric material from the region above the second current terminal using the second etching procedure.

Example 9: A method as in Example 7, in which forming the interconnect includes depositing conductive material that fills the first via opening.

Example 10: A method as in any of Examples 1-9, in which selectively removing the interlayer dielectric material in the first region includes performing an etching procedure that preferentially etches the interlayer dielectric material over the first dielectric material for an amount of time chosen to leave the first dielectric material intact in the first region.

Example 11: A method as in any of Examples 1-10, in which forming the second electrode in the first region comprises depositing conductive material that fills the second aperture and also forms an extension area adjacent to the second aperture wherein the conductive material overlies the first interlayer dielectric material.

Example 12: A method as in any of Examples 1-11, in which performing the etching procedure that preferentially etches the interlayer dielectric material over the first dielectric material also includes: forming a first via opening that exposes the first current terminal by removing the interlayer dielectric material from a region above the first current terminal; and forming a second via opening that exposes the second current terminal by removing the interlayer dielectric material from a region above the first current terminal. In this Example, the interconnect is formed before the second electrode is formed; a first end of the interconnect electrically contacts the first terminal within the first via opening; and a second end of the interconnect electrically contacts the second end of the second electrode.

Example 13: A semiconductor device that includes: a channel region defined in a semiconductor substrate; a first current terminal electrically coupled to a first end of the channel region; and a second current terminal electrically coupled to a second end of the channel region opposite the first end. The device also has a first dielectric material having a first dielectric thickness and overlying the channel region; a first interlayer dielectric material overlying the channel and the first electrode; and second interlayer dielectric material overlying the first interlayer dielectric material.

The device has a first aperture in the first dielectric material that overlies the channel region in between the first current terminal and the second current terminal; and an electrically conductive first electrode that extends within the first aperture that is in direct physical contact with a top surface of the channel region. The device also has an electrically conductive second electrode spaced apart from the first electrode.

The second electrode has a first end that overlies at least the first dielectric material and the channel region at a location between the first electrode and the second current terminal; and a second end that overlies at least a portion of the first electrode that is separated from the first electrode by the first and second interlayer dielectric materials.

The device is configured to provide an electrically conductive path from the first current terminal to the second current terminal via the channel region when a sufficient control voltage is applied to the first electrode.

Example 14: A device as in Example 13, in which the first end of the second electrode directly contacts the first dielectric layer; and the second electrode further includes an electrode extension that is disposed between the first end of the second and the second current terminal and is disposed above at least the first interlayer dielectric material.

Example 15: A device as in either of Examples 13 or 14, in which the first end of the second electrode directly contacts the first dielectric material; the first interlayer dielectric material and the second interlayer dielectric material have been removed from an area above the first dielectric material and beneath the first end of the second electrode; the first interlayer dielectric material has been removed by an etching procedure and is characterized by a first etch rate with respect to the etching procedure; and the first dielectric material is characterized by a second etch rate with respect to the etching procedure that is slower than the first etch rate.

Example 16: A device as in any of Examples 13-15, that further includes an electrically conductive interconnect that electrically couples the second electrode to the first current terminal, the interconnect overlying the first electrode and the first and second interlayer dielectric materials, and separated from the first electrode by the first and second interlayer dielectric materials.

Example 17: A device as in Example 16 in which wherein the interconnect electrically contacts the second electrode at the second end of the second electrode at a location overlying the first electrode Example 18: A device as in any of Examples 13-17, in which the second electrode includes a lateral extension that overlies the second interlayer dielectric material at a location between the first end of the second electrode and the second current terminal.

Example 19: A device as in any of Examples 13-18, in which the first end of the second electrode directly overlies the first interlayer dielectric material; and the second interlayer dielectric material is absent from an area above the first interlayer dielectric material and beneath the first end of the second electrode. In this Example, the first interlayer dielectric material is characterized by a first etch rate with respect to a dry etching procedure; and the second interlayer dielectric material is characterized by a second etch rate with respect to the dry etching procedure that is faster than the first etch rate.

Example 20: A device as in any of Examples 13-19, in which the channel region comprises a semiconductor heterostructure with a two-dimensional electron gas (2DEG) region formed at a semiconductor heterojunction beneath a surface of the channel region nearest to the first electrode.

The preceding detailed description and examples are merely illustrative in nature and are not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The preceding detailed description and examples are merely illustrative in nature and are not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

It should be understood that this invention is not limited in its application to the details of construction and the arrangement of components set forth in the preceding description or illustrated in the accompanying drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

The preceding discussion is presented to enable a person skilled in the art to make and use embodiments of the invention. Various modifications to the illustrated embodiments will be readily apparent to those skilled in the art, and the generic principles herein can be applied to other embodiments and applications without departing from embodiments of the invention. Thus, embodiments of the invention are not intended to be limited to embodiments shown, but are to be accorded the widest scope consistent with the principles and features disclosed herein. The preceding detailed description is to be read with reference to the figures, in which like elements in different figures have like reference numerals. The figures, which are not necessarily to scale, depict selected embodiments and are not intended to limit the scope of embodiments of the invention. Skilled artisans will recognize the examples provided herein have many useful alternatives and fall within the scope of embodiments of the invention.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first," "second" and other such numerical terms referring to structures do not imply a sequence or order unless clearly indicated by the context.

As used herein, a "node" or "terminal" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

What is claimed is:

1. A method of fabricating a semiconductor device comprising:
depositing interlayer dielectric material over a first dielectric layer and a first electrode on a semiconductor substrate, wherein:
the interlayer dielectric material comprises first interlayer dielectric material disposed over the first dielectric layer and a second interlayer dielectric material disposed over the first interlayer dielectric material;

the first dielectric layer is disposed above a channel region of the semiconductor substrate suitable for use as a semiconductive transistor channel;

the first electrode extends within a first aperture in the first dielectric layer and contacts a top surface of the channel region within the aperture; and the first electrode is disposed between a first current terminal electrically coupled to a first end of the channel region and a second current terminal electrically coupled to a second end the channel region opposite the first end of the channel region;

performing a first patterning step that includes selectively removing the interlayer dielectric material in a first region between the first electrode and the second current terminal, thereby leaving remaining dielectric material that includes the first dielectric layer above the channel region;

forming a second electrode having first and second ends, wherein:

the first end of the second electrode is adjacent to the first electrode in the first region;

the first end of the second electrode is separated from the top surface of the channel region by at least the first dielectric layer;

the second end of the second electrode is disposed above the first electrode and is separated from the first electrode by the remaining interlayer dielectric material; and forming a conductive interconnect that extends between the first current terminal and the second electrode and electrically couples the second electrode to the first current terminal, the interconnect being disposed above the first electrode and the remaining interlayer dielectric material;

wherein selectively removing the interlayer dielectric material in the first region comprises:

forming a second aperture in the second interlayer dielectric material by removing the second interlayer dielectric material from the first region using a first etching procedure followed by removing the first interlayer dielectric material from the first region using a second etching procedure; and wherein the first end of the second electrode extends within the second aperture.

2. The method of claim 1, wherein the interlayer dielectric material comprises a first interlayer dielectric material and a second interlayer dielectric material disposed above the first interlayer dielectric material;

wherein selectively removing the interlayer dielectric material in the first region further comprises forming a second aperture in the second interlayer dielectric material by removing the second interlayer dielectric material from the first region;

wherein the first end of the second electrode extends within the second aperture; and wherein the first end of the second electrode is separated from the channel region in the second aperture by the first dielectric layer and a portion of the first interlayer dielectric material disposed beneath the second aperture.

3. The method of claim 2, wherein forming the second aperture in the second interlayer dielectric material comprises:

performing an etching procedure that preferentially etches the second interlayer dielectric material over the first interlayer dielectric material for an amount of time chosen to leave at least a portion of the first interlayer dielectric material intact in the first region.

4. The method of claim 2, wherein forming the second electrode in the first region comprises:

depositing conductive material that fills the second aperture and also forms an extension area adjacent to the second aperture wherein the conductive material overlies the interlayer dielectric material.

5. The method of claim 1, wherein forming second electrode in the first region comprises depositing conductive material that fills the second aperture and also forms an extension area adjacent to the second aperture wherein the conductive material overlies the interlayer dielectric material.

6. The method of claim 1, wherein the first etching procedure is a dry plasma etching procedure and the second etching procedure is a wet chemical etching procedure.

7. The method of claim 6, wherein performing the first patterning step further comprises:

forming a first via opening that exposes the first current terminal by removing the second interlayer dielectric material from a region above the first current terminal using the first etching procedure followed by removing the first interlayer dielectric material from the region above the first current terminal using the second etching procedure; and forming a second via opening that exposes the second current terminal by removing the second interlayer dielectric material from a region above the second current terminal using the first etching procedure followed by removing the first interlayer dielectric material from the region above the second current terminal using the second etching procedure.

8. The method of claim 7, wherein forming the interconnect comprises depositing conductive material that fills the first via opening.

9. The method of claim 1, wherein selectively removing the interlayer dielectric material in the first region comprises:

performing an etching procedure that preferentially etches the interlayer dielectric material over the first dielectric layer for an amount of time chosen to leave the first dielectric layer intact in the first region.

10. The method of claim 9, wherein forming the second electrode in the first region comprises depositing conductive material that fills the second aperture and also forms an extension area adjacent to the second aperture wherein the conductive material overlies the first interlayer dielectric material.

11. The method of claim 9 wherein performing the etching procedure that preferentially etches the interlayer dielectric material over the first dielectric material also comprises:

forming a first via opening that exposes the first current terminal by removing the interlayer dielectric material from a region above the first current terminal; and forming a second via opening that exposes the second current terminal by removing the interlayer dielectric material from a region above the first second current terminal;

wherein the interconnect is formed before the second electrode is formed; and wherein a first end of the interconnect electrically contacts the first current terminal within the first via opening and a second end of the interconnect electrically contacts the second end of the second electrode.

* * * * *